Dec. 25, 1962 A. D. EVANS 3,070,762

VOLTAGE TUNED RESISTANCE-CAPACITANCE FILTER, CONSISTING OF INTEGRATED SEMICONDUCTOR ELEMENTS USABLE IN PHASE SHIFT OSCILLATOR

Filed May 2, 1960

INVENTOR

Arthur D. Evans

BY Stevens, Davis, Miller & Mosher

ATTORNEYS

United States Patent Office 3,070,762
Patented Dec. 25, 1962

3,070,762

VOLTAGE TUNED RESISTANCE-CAPACITANCE FILTER, CONSISTING OF INTEGRATED SEMICONDUCTOR ELEMENTS USABLE IN PHASE SHIFT OSCILLATOR

Arthur D. Evans, Farmers Branch, Tex., assignor to Texas Instrument Incorporated, Dallas, Tex., a corporation of Delaware Filed May 2, 1960, Ser. No. 26,341
6 Claims. (Cl. 333—70)

This invention relates to semiconductor networks and more particularly to such networks which utilize active elements as voltage-variable resistors.

Semiconductor networks have heretofore been proposed, illustrative of which are those disclosed in an application by Jack S. Kilby, Serial Number 791,602, filed February 6, 1959, and entitled "Miniaturized Electronic Circuits and Method of Making." According to that application entire electronic networks are fabricated entirely within tiny wafers of semiconductor material. Various portions of the material act as discrete circuit elements, and other portions of the material serve to make the required internal connections of certain of the circuit elements.

Although the subject matter of the Kilby application constitutes a major breakthrough in the art of circuit miniaturization, and although through its practice any of a wide variety of electronic networks can be formed within a single tiny wafer of semiconductor material, problems have arisen in certain circuit applications. Thus, for example, in some instances it is difficult to form resistors having a sufficiently high value. In other applications it is necessary that a variable resistor be utilized. In such cases, it would be necessary to utilize externally connected components of conventional type to achieve the desired characteristics, thereby reducing to a considerable extent the effectiveness of these networks in achieving true miniaturization of electronic systems.

One example of a circuit in which both of these problems prevail is the novel tuned circuit of the present invention.

The present invention comprises a novel voltage variable phase shifting circuit. In this circuit, field-effect devices function as voltage controlled resistors to provide a very high variable resistance. By utilizing voltage controlled resistors in the R-C feedback network, the frequency at which zero phase shift occurs is caused to vary as a function of the voltage impressed upon the gate of the field-effect device.

The circuit of the present invention is especially valuable in certain telemetering applications. By using the circuit of the present invention in a phase shift oscillator it is possible to derive an accurate indication of the potential impressed upon the gate electrode. The monitoring operation can be accomplished any number of ways such as utilizing a frequency meter directly connected to the oscillator or, for example, by utilizing the oscillator in a telemetering transmitter to modulate the carrier wave thereby providing the desired information.

It is therefore one object of the present invention to provide a semiconductor network which functions as a voltage variable tuned circuit.

Another object of the present invention is to provide an active element in a semiconductor network which exhibits variable resistance characteristics.

Still another object of the present invention is to provide a circuit particularly adapted to certain telemetering applications.

These and other objects of the present invention will become more readily understood as the detailed description of a specific embodiment of the invention unfolds and when taken in conjunction with the accompanying drawings in which.

Figures 1, 2, 3:
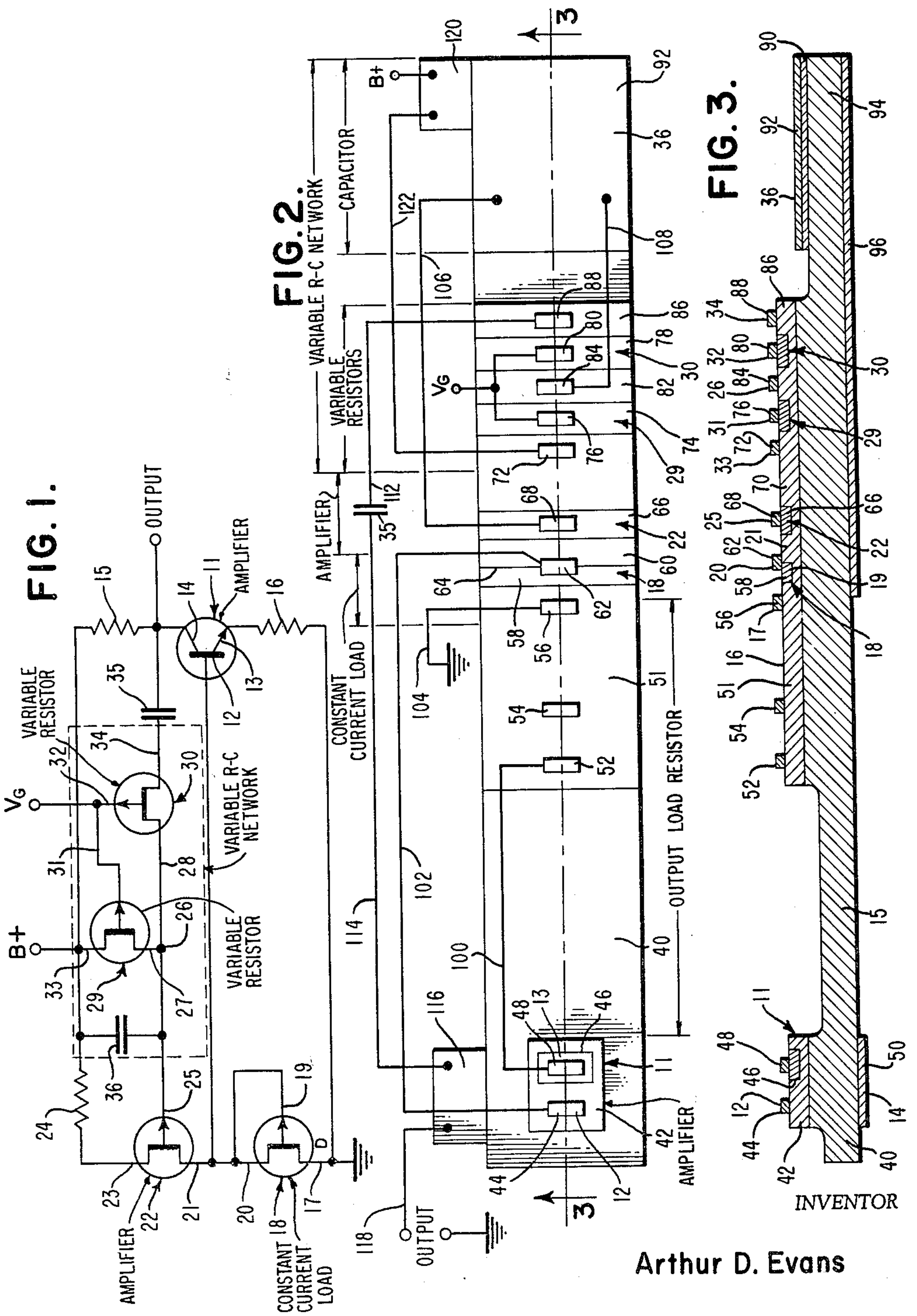
FIGURE 1 is a schematic representation of a zero phase shift, variable frequency oscillator utilizing the present invention.
FIGURE 2 is a plan view of a semiconductor network fabricated in accordance with the present invention.
FIGURE 3 is a view in cross section along line 3—3 of FIGURE 2.

Referring now to FIGURE 1 of the drawings, reference numeral 10 has been used to designate a variable frequency oscillator utilizing the present invention. The variable frequency oscillator 10 includes a bipolar transistor 11 having the usual base 12, emitter 13 and collector 14. The collector 14 is connected through resistor 15 to the source of positive potential, B+. The emitter 13 of transistor 11 is connected through resistor 16 to the drain 17 of unipolar device 18 which is at ground potential. In addition to the drain 17, the unipolar device 18 includes a gate 19 connected to the source 20 of the device. The source 20 of the device 18 is connected to the base 12 of the bipolar transistor 11. The source 20 of the unipolar device 18 and the base 12 of the bipolar device 11 are also connected to the drain 21 of a second unipolar device 22. The second unipolar device 22 has a source 23 connected through resistor 24 to the source of positive potential B+. The gate 25 of unipolar device 22 is connected to point 26. Drain 27 and source 28 of unipolar devices 29 and 30, respectively, are also connected to point 26. The gate terminals 31 and 32 of the unipolar devices 29 and 30, respectively, are connected to a source of gate voltage, $V_G$. The source 33 of device 29 is connected to B+. The drain 34 of unipolar device 30 is connected through capacitor 35 to the collector 14 of bipolar device 11. Capacitor 36 is connected between the source and drain terminals 33 and 27, respectively, of unipolar device 29.

The operation of this particular specific example of the invention will now be described. The unipolar devices 29 and 30 effectively act as resistors, with the value of resistance dependent on potential $V_G$ applied to gates 31 and 32, respectively. The unipolar devices 29 and 30, in conjunction with capacitors 35 and 36, form an R-C filter.

Bipolar device 11 is connected to function as a common emitter transistor amplifier whereas the unipolar device 22 is connected to function as an amplifier. The output from the unipolar device 22 is applied to the base 12 of the transistor 11 and will be 180° out of phase with the signal applied to the gate 25 of the unipolar device 22. Similarly, the signal appearing at the collector 14 of transistor 11 will be 180° out of phase with the signal appearing at the base 12 of transistor 11.

The circuit will operate as an oscillator at the frequency which produces zero phase shift in the R-C filter network, thus making the frequency of oscillation dependent upon the components used in the network. As the resistance of the unipolar devices 29 and 30 varies as the voltage $V_G$ varies, the frequency of oscillation is dependent upon the gate voltage $V_G$.

Turning now to FIGURES 2 and 3 of the drawing, a preferred configuration of a novel solid semiconductor network which performs the function of the circuit of FIGURE 1 is shown. The solid semiconductor network of FIGURES 2 and 3 can be fabricated utilizing principles set forth in the previously mentioned Kilby application. Thus, it is practical to use a wafer 40 of n-type conductivity silicon having a resistivity of approximately 7 ohm-centimeters. An oxide mask can then be formed on all surfaces of the wafer by placing the wafer in a tube and allowing steam to flow over the wafer.

A layer 42 of p-type conductivity material is formed in the wafer by diffusing gallium or other p-type conductivity impurity material into the wafer. Thereafter, the oxide mask is selectively removed from the surface of the wafer whenever it is desired to diffuse additional n-type conductivity impurity material. The selective removal of the oxide mask is preferably accomplished by utilizing photo-resist techniques. After the selective removal of the oxide film, the wafer is subjected to diffusion of an n-type impurity such as phosphorus to form the required emitter and gate regions. It is to be observed that whereas gallium will diffuse through an oxide layer, phosphorus will not and, therefore, these two particular impurities are especially adapted to this technique.

It must be noted that the diffusion depths and concentrations determine the characteristics of the various elements in the circuit and that it may be necessary to repeat the masking and diffusion process several times to produce circuit elements having the desired characteristics.

Once the diffusion processes are complete the wafer is masked with an etch-resistant material such as wax and etched with a suitable etchant to shape the wafer in the manner described in the Kilby application to form the desired resistors, etc. Contacts may be formed by evaporating a material such as nickel onto the desired areas. Capacitors can be formed by laying down an insulating oxide film and then evaporating an electricl contact onto the film.

Referring once more to FIGURES 2 and 3 of the drawing, it is seen that a transistor of mesa type construction is formed at one end of the wafer. It comprises a p-type region 42 having metallized ohmic contact 44 attached thereto. The emitter comprises a diffused n-type region 46 with an ohmic contact 48. Ohmic contact 50 is made to the lower portion of the original n-type material directly underneath the base which serves as a contact for the collector. Regions 42, 46 and the lower portion of the wafer correspond to the base 12, emitter 13, and collector 14 of transistor 11.

A second p-type region 51 functions as resistor 16. Multiple contacts 52 and 54 are provided to allow some choice in the value of resistor used. It is observed that the value of resistance will be determined by the sheet resistance of the p-type layer 51 and the length to width ratio of the p-type region. Contact 56 is a common connection to one end of the resistor 16 formed by region 51 and to the portion of the wafer that functions as the drain of what corresponds to the unipolar device 18. The gate of the unipolar device is formed by the n-type region 58. The p-type region 60 serves as a source for the unipolar device 18 and as the drain for a second region which corresponds to unipolar device 22. Metallized contact 62 shorts the junction 64 thereby effectively connecting the gate and source of that portion serving as unipolar device 18.

The n-type region 66 functions as the gate 25 for the second unipolar device 22 with the contact 68 providing the means for making connection thereto. The sheet resistance of p-type region 70 functions as resistor 24. Contact 72 is furnished to provide a means for ohmic contacting one end of the region 70. N-type region 74, with its ohmic contact 76, serves as the gate 31 for the third unipolar device 29. In a similar fashion, the n-type region 78 and ohmic contact 80 serve as the gate for the fourth unipolar device 30. The p-type region 82 with its ohmic contact 84 serves as the drain for the third unipolar device and a source for the fourth unipolar device. The p-type region 86 with ohmic contact 88 functions as the drain for the fourth unipolar device 30. A capacitor is formed on a depressed portion of the wafer by an oxide film 90 which serves as the dielectric, a metallized portion 92 which serves as one plate, the other plate being formed by that portion 94 of the original material which directly underlies the oxide film.

A large metallized region 96 covers a portion of the underside of the wafer. The sheet resistance of the original n-type material that lies between the collector contact 50 and the large metallized area 96 performs the function of resistor 15.

It is necessary that some circuit connections be made externally. Thus, lead 100 connects the diffused region 46 to one end of the region 51 and lead 102 connects the region 42 to the contact 62. Lead 104 connects contact 56 to ground. Contact 68 is connected to metallized layer 92 via lead 106 while lead 108 is used to connect contact 84 to the same layer 92. Lead 110 is used to connect the gate contacts 76 and 80, respectively, to the source of gate voltage $V_G$. Lead 112 connects the contact 88 to external capacitor 35 and lead 114 connects capacitor 35 to tab 116 which is attached to collector contact 50. The output terminal 118 is also attached to the collector tab 116. Tab 120 is attached to the metallized region 96 in a manner similar to that by which tab 116 its attached to collector contact 50. Lead 122 connects the tab 120 to the contact 72 thereby completing the circuit. It is to be noted that the B+ potential is applied to the tab 120.

The capacitor 35 is shown as an additional element which must be connected to the semiconductor network for it to function properly. It is to be noted that the capacitor 35 can be fabricated on the same piece of semiconductor material in the same manner as the capacitor 36. As such, it would be formed on the lower side of the wafer 40 adjacent the collector tab 50. However, as the capacitor 35 requires a high value of capacitance it has been found more practical to utilize a separate wafer of semiconductor material and, thereafter, to mount the wafers on a common ceramic block and connect as shown.

In addition, for low frequency operation it would be possible to replace many of the external leads shown with small conductors which would be evaporated onto the surface of the wafer over an insulating coating. It has been found, however, that the capacitance produced by these leads would introduce coupling problems at higher operating frequencies.

It must be emphasized here that only a preferred embodiment of this invention has been described above, and that other variations and modifications thereof may be made without departing from the scope of this invention, which is defined in the appended claims.

Thus, for example, although the invention has been described with regard to its use in a zero phase shift oscillator, it could be used in any application requiring a phase shifting tuned filter.

What is claimed is:

1. A semiconductor network adapted for operation as a tuned filter and comprising a wafer of semiconductor material, a surface layer defined in said wafer and separated from the remainder thereof by a P-N junction, a pair of unipolar field-effect devices defined in said surface layer, a capacitor formed on said wafer at a position spaced from said surface layer, and means connecting said capacitor to a portion of said surface layer.

2. A semiconductor network adapted for operation as a tuned filter and comprising a wafer of single crystal semiconductor material, a first region of one conductivity-type defined in said wafer, a second region of the opposite conductivity-type defined adjacent the surface of said wafer contiguous to said first region, a third region and a fourth region defined adjacent the surface of said wafer contiguous to said second region, said third and fourth regions being spaced from said first region and being spaced from one another by a common portion of said second region, the remaining portions of said second region being connected to said common portion only by thin channel portions of said second region underlying said third and fourth regions whereby a pair of field-effect devices are provided having a common electrode, a coating of dielectric material extending over at least a portion of the surface of said first region, conductive means overlying at least a portion of said dielectric coating to provide at least one capacitor, and means connecting said conductive means to said second region.

3. Apparatus according to claim 2 wherein said last named means connects said conductive means to said common portion; and wherein an area of said first region is conductively connected to one of said remaining portions of said second region.

4. Apparatus according to claim 2 wherein said third and fourth regions are connected together by second conductive means; and wherein a variable bias source is connected to said second conductive means to provide variable frequency translation characteristics of said semiconductor network.

5. Apparatus according to claim 1 wherein each of said field effect devices includes gate, source and drain electrodes, and wherein said means connecting said capacitor to said portion is effective to conductively interconnect said capacitor in shunt across the source and drain electrodes of one of said field-effect devices.

6. Apparatus according to claim 5 wherein means are provided to apply a variable voltage to the gates of both of said field effect devices.

References Cited in the file of this patent

UNITED STATES PATENTS

| | | |
|---|---|---|
| 2,321,269 | Artzt | June 8, 1943 |
| 2,601,416 | Idzerda | June 24, 1952 |
| 2,744,970 | Shockley | May 8, 1956 |
| 2,967,277 | Hahnel | Jan. 3, 1961 |

OTHER REFERENCES

Selected Semiconductor Circuits Handbook, pages 5-38 and 5-39, republished by John Wiley & Son, 1960.